(12) United States Patent
Wu (10) Patent No.: US 8,546,955 B1
(45) Date of Patent: Oct. 1, 2013

(54) MULTI-DIE STACK PACKAGE

(75) Inventor: Ephrem C. Wu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/587,716

(22) Filed: Aug. 16, 2012

(51) Int. Cl.
*H01L 23/52* (2006.01)
*H01L 23/48* (2006.01)
*H01L 29/40* (2006.01)

(52) U.S. Cl.
USPC .......... 257/777; 257/E25.013; 257/686; 257/723; 438/108

(58) Field of Classification Search
USPC .......... 257/E25.013, E25.018, 685, 686, 257/723, 777; 438/108, 109; 361/760
See application file for complete search history.

(56) References Cited

U.S. PATENT DOCUMENTS

| | | | | |
|---|---|---|---|---|
| 7,687,896 | B2 * | 3/2010 | Shibata | 257/686 |
| 7,754,532 | B2 * | 7/2010 | Farrar | 438/113 |
| 8,274,794 | B2 * | 9/2012 | Huang et al. | 361/735 |
| 8,405,221 | B2 * | 3/2013 | Imai | 257/773 |
| 2001/0020741 | A1 * | 9/2001 | Masayuki et al. | 257/685 |
| 2006/0038272 | A1 * | 2/2006 | Edwards | 257/686 |
| 2007/0090534 | A1 * | 4/2007 | Iwasaki et al. | 257/777 |
| 2008/0054489 | A1 * | 3/2008 | Farrar et al. | 257/777 |
| 2008/0203554 | A1 * | 8/2008 | Nishio et al. | 257/686 |
| 2008/0203581 | A1 * | 8/2008 | Thomas et al. | 257/777 |
| 2009/0267238 | A1 * | 10/2009 | Joseph et al. | 257/777 |
| 2009/0321948 | A1 * | 12/2009 | Wang et al. | 257/777 |
| 2012/0063190 | A1 * | 3/2012 | Koh | 365/51 |
| 2012/0217654 | A1 * | 8/2012 | Shin et al. | 257/777 |
| 2012/0248629 | A1 * | 10/2012 | Knickerbocker et al. | 257/777 |
| 2012/0273970 | A1 * | 11/2012 | Kuroda | 257/777 |

OTHER PUBLICATIONS

Doany, F.E., et al., "300-Gb/s 24-Channel Bidirectional Si Carrier Transceiver Optochip for Board-Level Interconnects", Proc. of 58th Electronic Components and Technology Conference, pp. 238-243, Jun. 2008.

Doany, F.E., et al., "Dense 24 TX+24 RX Fiber-Coupled Optical Module Based on a Holey CMOS Transceiver IC", Proc. of 60th Electronic components and Technology Conference, pp. 247-255, Jun. 2010.

Guckenberger, D., et al., "Advantages of CMOS Photonics for Future Transceiver Applications", ECOC 2010, Torino Italy, Tu4.C.2, Sep. 2010.

Hardesty, Larry, "First Germanium Laser", Feb. 4, 2010, 2 pages, MIT News Office, http://web.mit.edu/newsoffice/2010/first-germanium-laser.html.

Park, H., et al., "Design and Fabrication of Optically Pumped Hybrid Silicon-AlGaInAs Evanescent Lasers", IEEE Journal of Selected Topics in Quantum Electronics, vol. 12, Issue 6, Part 2, pp. 1657-1663, 2006.

(Continued)

*Primary Examiner* — Chris Chu
(74) *Attorney, Agent, or Firm* — W. Eric Webostad (57) ABSTRACT

An embodiment of an apparatus is disclosed. This embodiment of the apparatus includes an interposer, a first die stack, a second die stack, a third die stack, and a fourth die stack which are all coupled to the interposer. The interposer provides a common base for and a stratum of each of the first die stack, the second die stack, the third die stack, and the fourth die stack. The first die stack includes an optical engine. The optical engine includes at least one optical engine die. The second die stack includes a plurality of programmable resource dies. The third die stack includes at least one memory die. The fourth die stack includes a serializer-deserializer die.

20 Claims, 10 Drawing Sheets

(56) References Cited

OTHER PUBLICATIONS

Rong, H., et al., "Recent Development on Silicon Raman Lasers and Amplifiers", 19$^{th}$ Annual Meeting of the IEEE Lasers and Electro-Optics Society, pp. 929-930, 2006.

Rong, H., et al., "A continuous—wave Raman silicon laser", Nature, vol. 433, Feb. 17, 2005, pp. 725-728, http://optoelectronics.ece.ucsb.edu/sites/default/files/publications/Rong05nature2.pdf.

Sysak, M. et al., "Experimental and Theoretical Analysis of Thermal Impedance in a Hybrid Silicon Evanescent Laser", 20$^{th}$ Annual Meeting of the IEEE Lasers and Electro-Optics Society, pp. 827-828, 2007.

U.S. Appl. No. 13/399,939, filed Feb. 17, 2012, Wu, Ephrem C. et al., Xilinx, Inc., 2100 Logic Drive, San Jose, CA USA.

* cited by examiner

MULTI-DIE STACK PACKAGE

FIELD OF THE INVENTION

An embodiment relates to integrated circuit devices ("ICs"). More particularly, an embodiment relates to an IC that is a multi-die stack package.

BACKGROUND

Modern networks involve multiple switches, servers, and other networking components, including without limitation networking line interfaces. All of these components tend to draw significant amounts of power. Along those lines, a conventional networking line interface may consist of separately packaged components, such as for example optical modules, Field Programmable Gate Arrays ("FPGAs") with serializer-deserializer ("SERDES") capabilities, and Dynamic Random Access Memory ("DRAM") modules. Such optical modules may include a laser-based optical integration, such as vertical-cavity surface-emitting laser-based ("VCSEL-based") optical integration for example. Such optical modules may too involve multiple chips, such as for example a receiver optical chip and a transmitter optical chip, as well as corresponding electrical driver and receiver chips. Accordingly, all of these separately package components draw power and consume a significant number of pins. Such pin count can be excessive leading to constraining bandwidth. Moreover, a laser generally has a limited thermal budget, and thus is a thermal bottleneck for integration with logic.

Hence, it would be desirable and useful to provide a networking line interface that overcomes one or more of the above-described limitations.

SUMMARY

One or more embodiments generally relate to a multi-die stack package.

An embodiment relates generally to an apparatus. In such an embodiment, there is an interposer. A first die stack, a second die stack, a third die stack, and a fourth die stack are coupled to the interposer. The interposer provides a common base for and a stratum of each of the first die stack, the second die stack, the third die stack, and the fourth die stack. The first die stack includes an optical engine. The optical engine includes at least one optical engine die. The second die stack includes a plurality of programmable resource dies. The third die stack includes at least one memory die. The fourth die stack includes a serializer-deserializer die. The interposer, the at least one optical engine die, the plurality of programmable resource dies, the at least one memory die, and the serializer-deserializer die are in different upward facing and downward facing combinations.

Another embodiment relates generally to another apparatus. In such embodiment, there is an interposer. A first die stack, a second die stack, a third die stack, a fourth die stack, and a fifth die stack are coupled to the interposer. The interposer provides a common base for and a stratum of each of the first die stack, the second die stack, the third die stack, the fourth die stack, and the fifth die stack. The first die stack includes an optical engine. The optical engine can include a plurality of optical engine dies. The second die stack includes a plurality of programmable resource dies. The third die stack includes at least one memory die. The fourth die stack includes a serializer-deserializer die. The fifth die stack includes a power supply die.

Yet another embodiment relates generally to a method for providing a router line card. In such an embodiment, an interposer is obtained. A first known-good module, a second known-good module, a third known-good module, and a fourth known good module are coupled to the interposer to respectively provide a first die stack, a second die stack, a third die stack, and a fourth die stack. The interposer provides a common base for and a stratum of each of the first die stack, the second die stack, the third die stack, and the fourth die stack. The first die stack includes an optical engine including at least one optical engine die. The second die stack includes a plurality of programmable resource dies. The third die stack includes at least one memory die. The fourth die stack includes a serializer-deserializer die. The interposer, the at least one optical engine die, the plurality of programmable resource dies, the at least one memory die, and the serializer-deserializer die are in different upward facing and downward facing combinations.

BRIEF DESCRIPTION OF THE DRAWINGS

Accompanying drawings show exemplary embodiments. However, the accompanying drawings should not be taken to limit the embodiments shown, but are for explanation and understanding only.

FIGS. 4-1 through 4-4 are block diagrams depicting exemplary embodiments of orientations of die stacks.

FIGS. 6-1 is a block diagram of a cross-sectional view depicting an exemplary embodiment of a multi-die stack package from one side.

FIGS. 6-2 is a block diagram of a cross-sectional view depicting the exemplary embodiment of the multi-die stack package of FIGS. 6-1 from an opposite side.

FIGS. 10-1 is a block diagram of a cross-sectional view depicting yet another exemplary embodiment of a multi-die stack package from one side.

FIGS. 10-2 is a block diagram of a cross-sectional view depicting the exemplary embodiment of the multi-die stack package of FIGS. 10-1 from an opposite side.

DETAILED DESCRIPTION

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding. A conventional networking line card conventionally includes multiple separately packaged electronic ICs and optical modules. Accordingly, these networking line cards draw significant amounts of power.

With the above general understanding borne in mind, various embodiments for a multi-die stack package are generally described below. Such multi-die stack package may be used to implement a network or router line card to reduce power consumption thereof. Such an IC package includes an interposer upon which multiple die stacks of one or more die each are coupled to provide a single packaged part that may be used to provide a device such as a router line card. Such a single packaged part may reduce power consumption in comparison to a multiple component router line card. In an embodiment, a laser may be omitted from such single packaged part due to thermal budget considerations.

Because one or more of the above-described embodiments are exemplified using a particular type of IC, a detailed description of such an IC is provided below. However, it should be understood that other types of IC packages may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
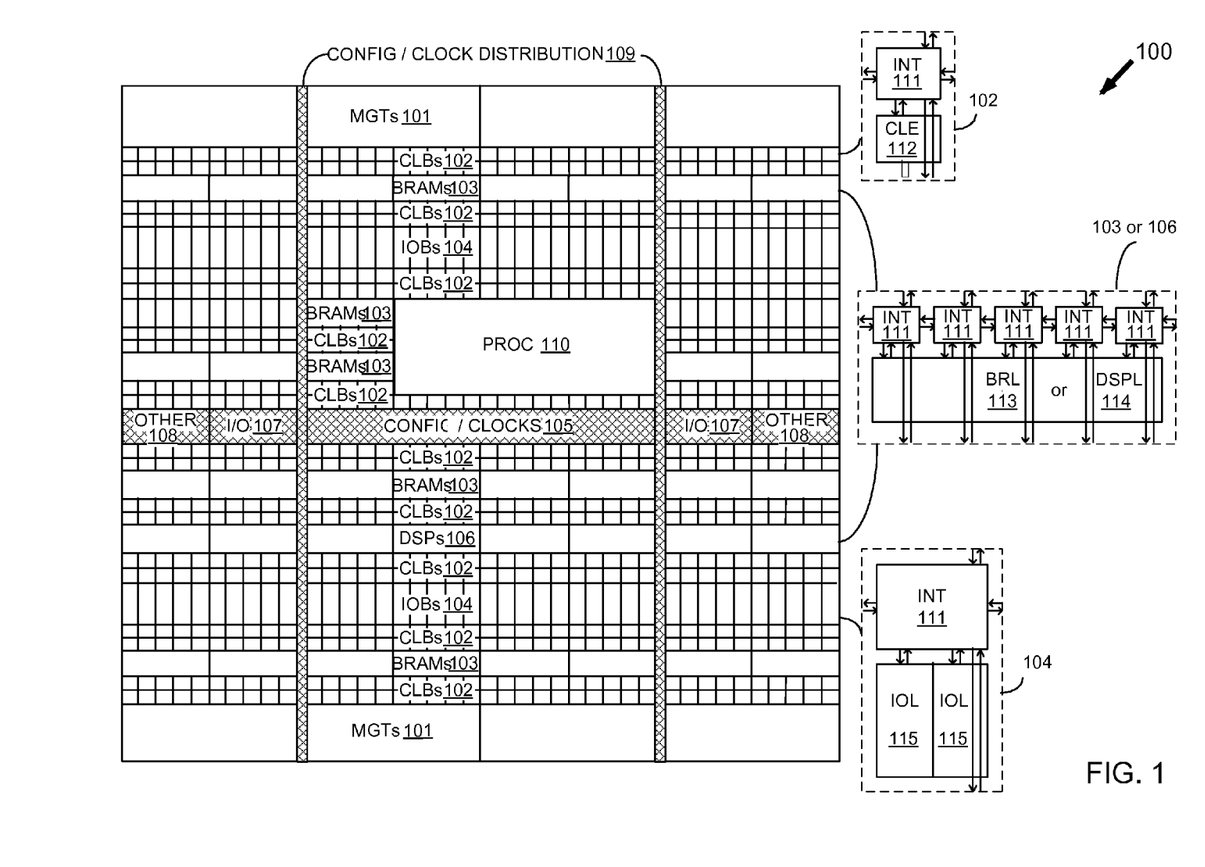
FIG. 1 is a simplified block diagram depicting an exemplary embodiment of a columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
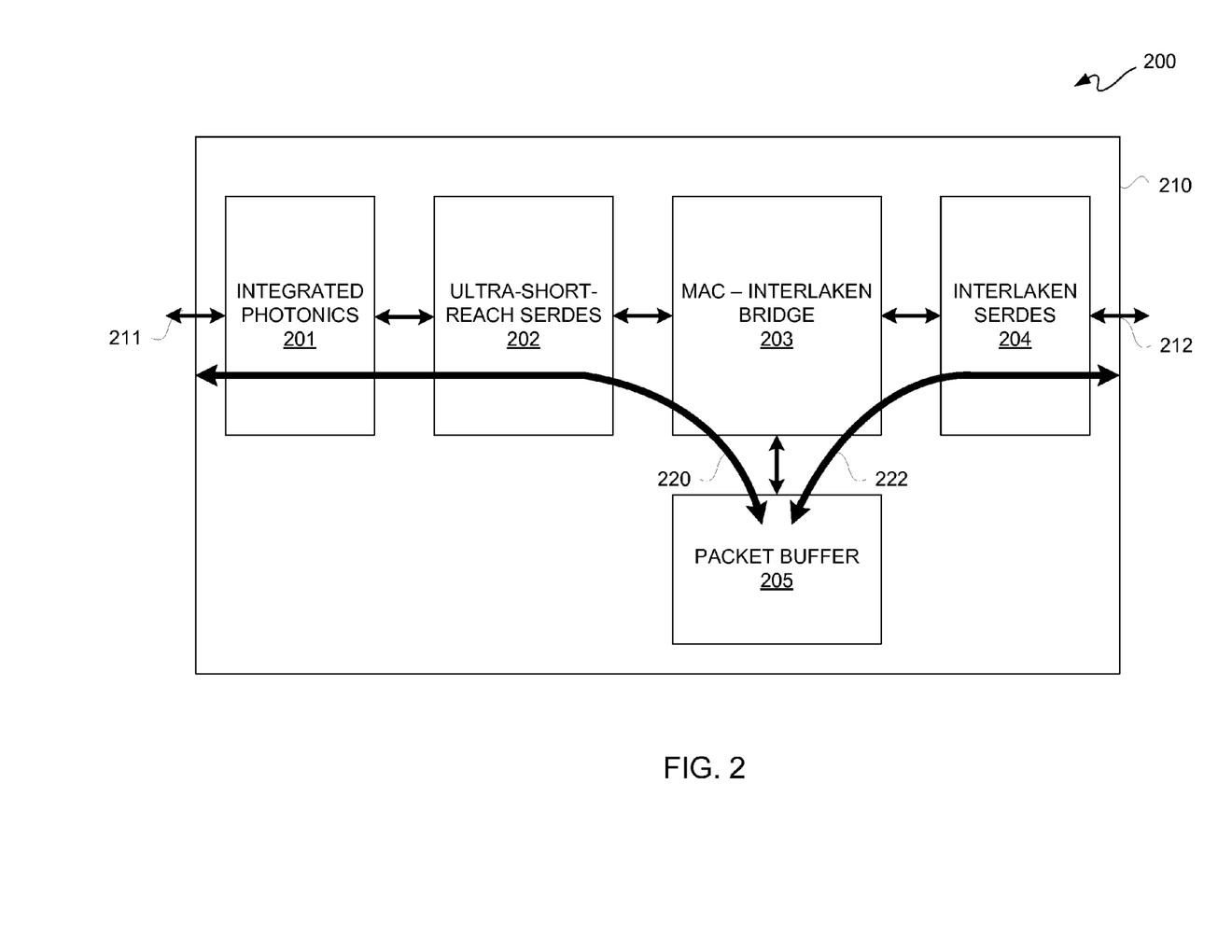
FIG. 2 is a block diagram depicting an exemplary embodiment of a network core/edge router line card multi-die stack package ("multi-die stack package").

FIG. 2 is a block diagram depicting an exemplary embodiment of a network core/edge router line card multi-die stack package ("multi-die stack package") 200. Multi-die stack package 200, as described below in additional detail, includes multiple stacks of dies to provide what may be referred to as a three dimensional ("3D") integrated circuit package.

Multi-die stack package 200 includes an interposer or carrier 210 and modules 201 through 205. Effectively, modules 201 through 205 are coupled to interposer 210 for packaging as a single multi-die stack package 200. Interposer 210 may be a silicon interposer or other dielectric to provide a common base for each of a plurality of die stacks, as described below in additional detail. In this exemplary embodiment, interposer 210 is a passive interposer. However, in another embodiment, interposer 210 may be an active interposer. By passive interposer, it is generally meant that such interposer includes no transistor.

Modules 201 through 205 may include one or more known-good dies, as having been previously tested prior to coupling to interposers 210. Along those lines, a module may include multiple dies stacked, and such stacked multiple dies may be provided as stack assembly which is tested prior to coupling to interposer 210 to provide known-good assemblies for coupling to interposer 210 to provide various stacks. In other words, modules 201 through 205 may be known-good modules. After coupling to interposer 210, such multi-die stack package may have fiber optic cabling attached to it, packaged and tested, including without limitation a final test prior to shipment.

In an embodiment, such modules 201 through 205 may be as follows: integrated photonics 201, ultra-short-reach serializer-deserializer ("SERDES") 202, media access controller ("MAC")-Interlaken bridge 203, Interlaken SERDES 204, and packet buffer 205. Even though an Interlaken embodiment is described herein for purposes of clarity, it should be understood that another type of interconnect protocol may be used. However, generally multi-die stack package 200 is for 100 gigabit ("Gb") or larger Ethernet.

Integrated photonics 201 may be coupled to a line side for bidirectional communication using one or more optical fibers, as generally indicated by arrow 211. Integrated photonics 201 may be provided using a first die stack, which includes an "optical engine." MAC-Interlaken bridge 203 may be provided using a second die stack, which includes two or more programmable resource dies, such as, for example, two or more programmable logic dies. In an embodiment, such two or more programmable logic dies may be two or more PLD dies. More particularly, in an embodiment, such two or more programmable logic dies may be two or more FPGA dies. For purposes of clarity by way of example not limitation, it shall be assumed that FPGA dies are used, even though in other embodiments other types of integrated circuit dies may be used to provide MAC-Interlaken bridge 203, including without limitation Application Specific Standard Products ("ASSP") dies.

Packet buffer 205 may be provided using a third die stack, which includes one or more memory dies. Any of a variety of types of memory may be used provided such memory is capable of storing packets. For purposes of clarity by way of example not limitation, it shall be assumed that packet buffer 205 includes two or more memory dies capable of dynamic random access. For purposes of clarity by way of example not limitation, such memory dies are referred to herein as dynamic random access memory ("DRAM") dies without reference to any particular type of memory cell used to provide such capability. Types of memory that may be used include DRAM, SRAM, eDRAM, and eSRAM, among other types of memories.

Ultra-short-reach SERDES 202 and Interlaken SERDES 204 may both be provided using a fourth die stack, which includes a die having both of such SERDES, as well as input/output drivers ("I/Os"). Ultra-short-reach SERDES 202 may couple integrated photonics 201 and MAC-Interlaken bridge 203 for bidirectional communication. MAC-Interlaken bridge 203 may be coupled to a system side, as generally indicated by arrow 212, through Interlaken SERDES 204 for bidirectional communication. A system side may include one or more network processing units ("NPUs"), traffic managers, and/or backplane interfaces. Mac-Interlaken bridge 203 may be directly coupled to packet buffer 205 for bidirectional communication.

Accordingly, as generally indicated by arrow 220, packets may flow to and from a line side 211 from and to packet buffer 205 through integrated photonics 201, ultra-short-reach SERDES 202, and MAC-Interlaken bridge 203. Furthermore, as generally indicated by arrow 222 packets may flow to and from a system side 212 from and to packet buffer 205 through Interlaken SERDES 204 and MAC-Interlaken bridge 203. Thus, packet buffer 205 may provide a bi-directional buffer for a line card as described herein.

Figure 3:
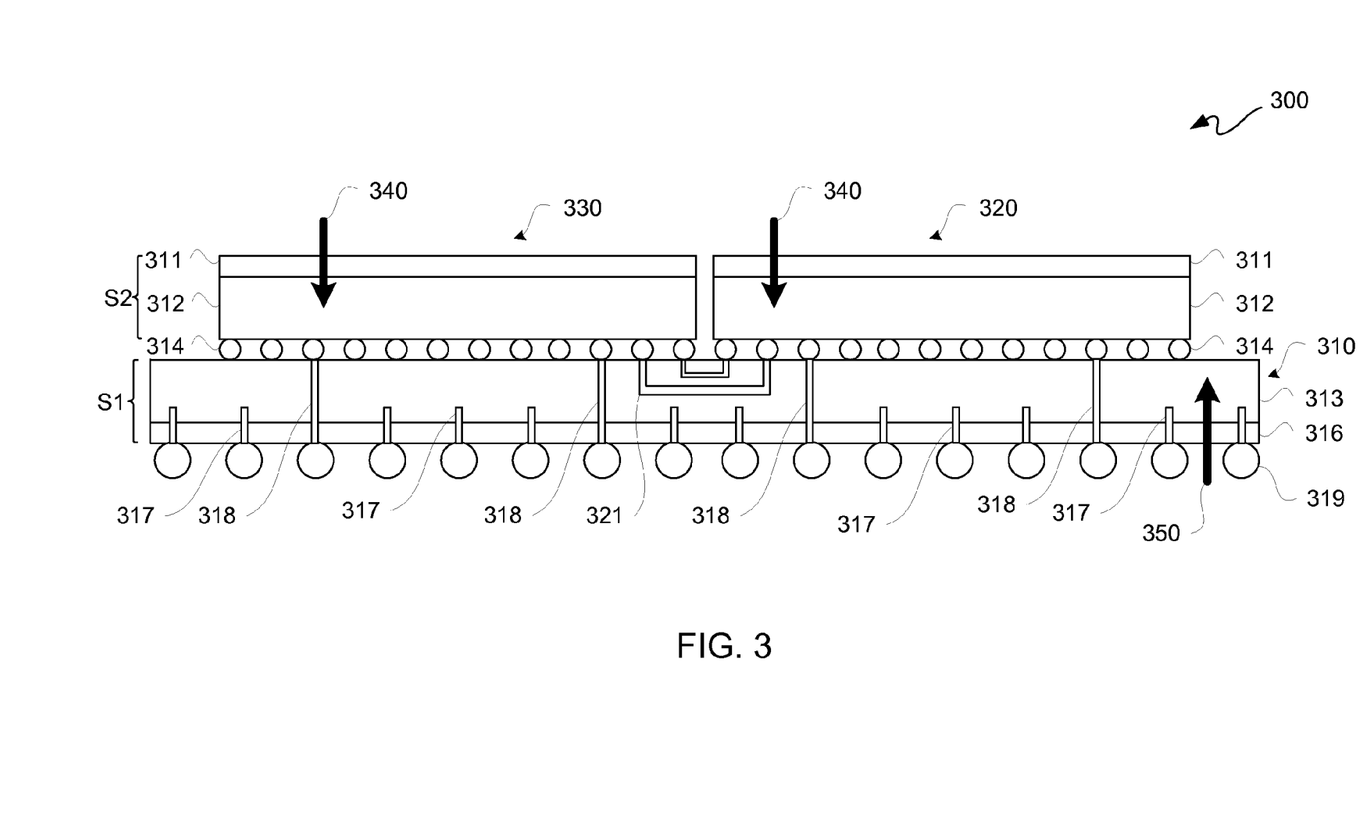
FIG. 3 is a block diagram depicting an exemplary embodiment of a three dimensional ("3D") die stack.

FIG. 3 is a block diagram depicting an exemplary embodiment of a 3D die stack 300. Die stack 300 includes integrated circuit dies 320 and 330 coupled to an interposer 310. Die stack 300 has a bottom stratum S1 provided by interposer 310, and a top stratum S2 provided by integrated circuit dies 320 and 330. Integrated circuit dies 320 and 330 are in the same stratum. Thus, 3D die stack 300 is a two strata die stack.

Each of integrated circuit dies 320 includes a substrate 311 upon which one or more layers are formed to provide multiple layers 312. Interposer 310, which may be a silicon interposer, may be formed upon a silicon substrate 316. One or more layers may be formed upon substrate 316 to provide multiple layers 313.

Interconnects 314, such as microbumps for example, may be used to couple down facing integrated circuit dies 320 and 330 to up facing interposer 310. In other words, interconnects 314 may be used for face-to-face interconnecting between a top and a bottom strata. Multiple layers 313 may include inter-die through interposer interconnects 321 for die-to-die interconnecting, such as interconnecting dies 320 and 330 to one another through interconnects 314 and 321. Interconnects 319, which may be C4 bumps or other interconnects larger than interconnects 314 for example, may be used to couple die stack 300 to a package substrate or to a printed circuit board.

A substrate side is generally referred to as a backside of an in-process semiconductor wafer, and a multiple layers side is generally referred to as a face side of such an in-process semiconductor wafer. Along those lines, arrows 340 indicate that integrated circuit dies 320 and 330 face in a downward direction ("D"), namely substrates 311 are located above multiple layers 312 of such substrates. In other words, integrated circuit dies 320 and 330 generally are inverted with respect to an orientation in which such dies were in the main formed. Arrow 350 indicates that interposer 310 faces in an upward direction ("U"), namely substrate 316 is located below multiple layers 313 of such substrate. In other words, interposer 310 generally is in a same orientation with respect to an orientation in which such interposer in the main formed.

In order to couple interconnects 319 with one or more of multiple layers 313, vias 317 and 318 may be formed. Vias 317 and 318 for substrate 316 being a silicon substrate may be referred to as Through Silicon Vias ("TSVs"). Vias 317 may terminate within multiple layers 313. Vias 318 may extend through multiple layers 313 to interconnects 314.

With the above description borne in mind, a multi-die stack package may generally be defined by: a number of stacks, S; a number of strata in a stack s, $N_s$, a device type vector for a stack s; and a direction vector for a stack s. A device type vector for a stack s may be described as $<t_1, t_2, \ldots, t_{Ns}>$, where for a device at stratum i:

$t_i$='A' if such die is an active die; and
$t_i$='P' if such die is a passive die.

A direction vector for a stack s may be described as $<d1, d2, \ldots, d_{Ns}>$, where for a device at stratum i:

$d_i$='U' if such die faces up; and
$d_i$='D' if such die faces down.

Along those lines, FIGS. 4-1 through 4-4 are block diagrams depicting exemplary embodiments of orientations of die stacks 401 through 404, respectively. Each of dies stacks 401 through 404 include two dies 411 and 412 coupled to one another using interconnects 314. Through substrate vias and other vias are not illustratively depicted for purposes of clarity, but may be present. Multiple orientations of die stacks are possible, including face-to-face <D,D> as in die stack 401, face-to-back <U,U> as in die stack 402, face-to-face <U,D> as in die stack 403, and face-to-back <D,U> as in die stack 404.

Figure 5:
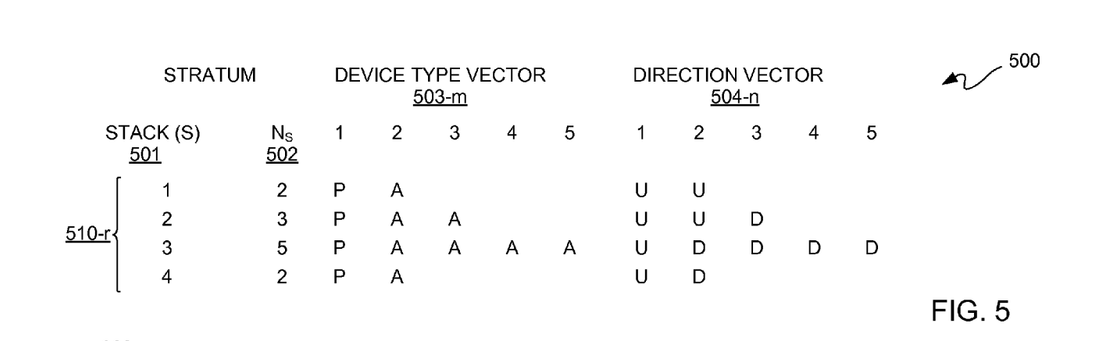
FIG. 5 is a table diagram depicting an exemplary embodiment of a multi-die stack package strata chart ("strata chart").
Figure 8:
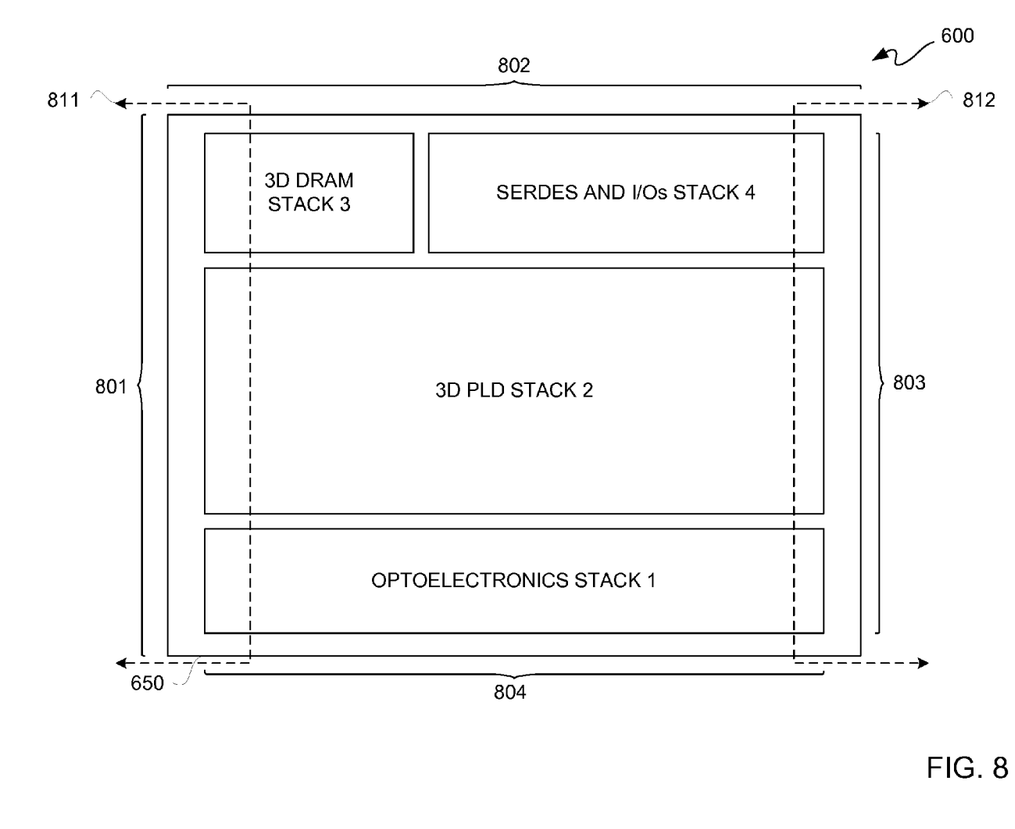
FIG. 8 is a block diagram of a top-down view depicting the exemplary embodiment of the multi-die stack package of FIGS. 6-1 and 6-2.

FIG. 5 is a table diagram depicting an exemplary embodiment of a multi-die stack package strata chart ("strata chart") 500. Stratum chart 500 is for multi-die stack package 600 of FIGS. 6-1 and 6-2. FIGS. 6-1 is a block diagram of a cross-sectional view depicting an exemplary embodiment of a multi-die stack package 600 from one side, and FIGS. 6-2 is a block diagram of a cross-sectional view depicting the exemplary embodiment of multi-die stack package 600 from an opposite side. FIG. 8 is a block diagram of a top-down view depicting the exemplary embodiment of multi-die stack package 600 of FIGS. 6-1 and 6-2. The cross-sectional view of FIGS. 6-1 is along dashed line 811 of FIG. 8, and the cross-sectional view of FIGS. 6-2 is along dashed line 812 of FIG. 8. Stratum chart 500 is further described simultaneous reference to FIGS. 5, 6-1, 6-2, and 8.

Figure 61:
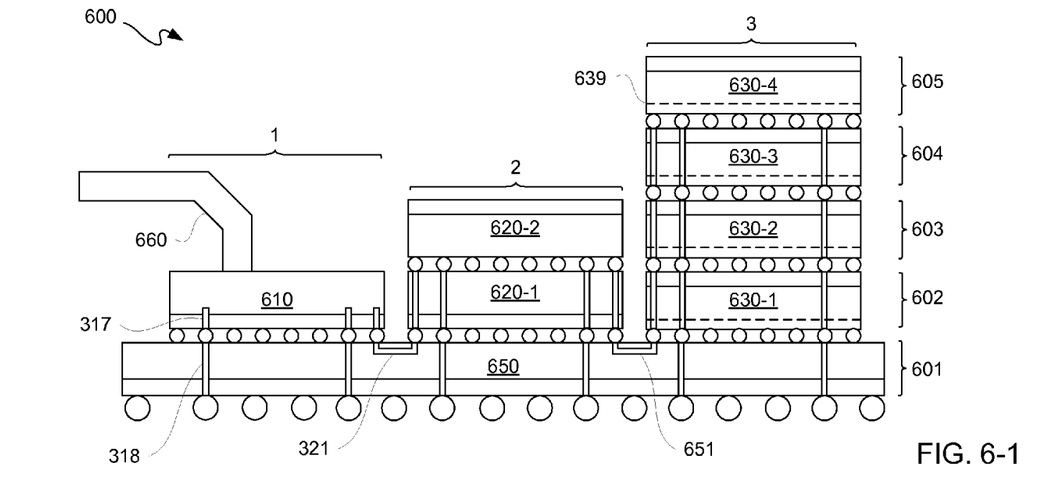
Figure 62:
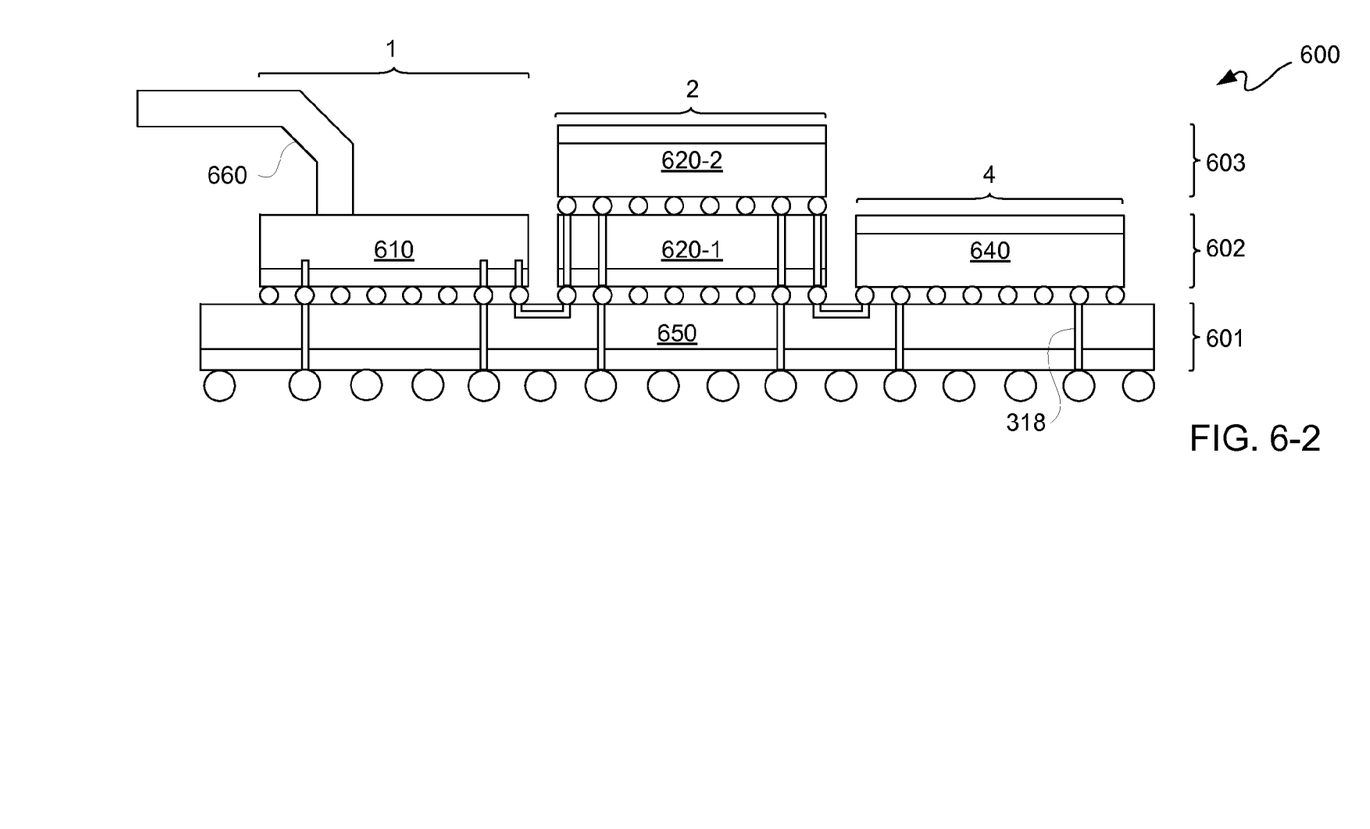

Using the above-described nomenclature, strata chart 500 includes stack number column 501, number of strata in a stack column ("stacked column") 502, m device type vector columns 503-1 through 503-5, and n direction vector columns 504-1 through 504-5. Rows 510 correspond to stack numbers in FIGS. 6-1 and 6-2.

For row 510-1 or optoelectronics stack 1, there are 2 strata, as indicated in stack column 502, composed of stratum 601 and stratum 602. As indicated in and by device type vector column 503-1, interposer 650 occupies stratum 601 and is a passive die. As indicated in and by device type vector column 503-2, "optical engine" 610 occupies stratum 602 and is an active die. Stratum 601 provided by interposer 650 is a common base to all of stacks 1 through 4. As indicated in direction vector column 504-1 for stack 1, interposer 650 faces upward. As indicated in direction vector column 504-2 for stack 1, "optical engine" 610 faces upward.

Generally, an optical engine 610 may include one or more dies, and in some embodiments optical engine may further include its own mechanical platform. With VCSELs for instance, three dies may be used to provide an optical engine 610, namely a VCSEL die or more generally an optical transmitter ("TX") die, a photo detector ("PD") die or more generally an optical receiver ("RX") die, and an electrical RX/TX die or more generally an optoelectronics interface die. In such an embodiment, an RX/TX electrical die may provide a TX that connects between an FPGA and a VCSEL, and an RX that connects between a PD and an FPGA. For optical engine 610 being a silicon photonics embodiment, a separate laser die may be used. Such a laser die may be a small chip mounted on silicon photonics or be in its own package off-chip or out-of-package. However, others have grown GaAs on Si to make a laser on a silicon-based substrate die, namely a single die may be used in another embodiment of silicon photonics. For purposes of clarity and not limitation, optical engine 610 is illustratively depicted as a single die. However, optical engine 610 may be multiple dies, whether all inside of a same package or some of which are outside of a same package. Some of such multiple dies may be stacked on one another.

Receivers and transmitters of optical engine 610 may be coupled to fiber optic cables 660 for communication at a serial optical line rate per wavelength. In another embodiment, optical engine 610 may face down; however, this involves having waveguides that extend through interposer 650 for optical coupling of fiber optic cables 660 to optical engine 610. This may further include other integration complexities, such as integration of micro-lenses.

For row 510-2 or 3D PLD stack 2, there are 3 strata, as indicated in stack column 502, composed of strata 601, 602, and 603. As indicated in and by device type vector column 503-1, interposer 650 occupies stratum 601 and is a passive die. As indicated in and by device type vector column 503-2, programmable logic dies (e.g., FPGAs in this embodiment) 620-1 and 620-2 respectively occupy stratum 602 and 603, and both programmable logic dies 620 are active dies. Even though two programmable logic dies 620 are illustratively depicted in this embodiment, greater numbers of programmable logic dies 620 may be stacked one upon another in other embodiments. Thus, generally, at least two memory dies 630 may be used, as may vary from embodiment to embodiment. As indicated in direction vector column 504-1 for stack 2, interposer 650 faces upward. As indicated in direction vector column 504-2 for stack 2, programmable logic die 620-1 faces upward, and programmable logic die 620-2 faces downward. Thus, programmable logic dies 620-1 and 620-2 face one another. By facing one another, top metal layers of each die are face-to-face, which promotes having more interconnects between dies. Along those lines, rather than using TSVs for example for interconnecting same direction facing die through a substrate, dies which face one another may be interconnected to one another by microbumps or other small dimensioned interconnects. In other words, when the dies are face-to-face, fewer, if any, TSVs may be used in coupling two dies to one another in favor of microbumps. As microbumps have a significantly smaller cross-section than TSVs, interconnect density may be greater by using microbumps over TSVs. Such increase in interconnect density may be used to increase communication, such as parallel communication. Communication to and from programmable logic dies 620-1 and 620-2 may be conducted in parallel to enhance overall bandwidth.

For row 510-3 or 3D DRAM stack 3, there are 5 strata, as indicated in stack column 502, composed of strata 601 through 605. As indicated in and by device type vector column 503-1, interposer 650 occupies stratum 601 and is a passive die. As indicated in and by device type vector column 503-2, memory dies (e.g., DRAMs in this embodiment) 630-1 through 630-5 respectively occupy strata 602 through 605, and all such memory dies 630 are active dies. In an embodiment, memory dies 630 may be compatible or in compliance with a JEDEC high-bandwidth memory ("HBM") specification for a logic-to-DRAM interface 651. Even though four memory dies 630 are illustratively depicted in this embodiment, other numbers of memory dies 630 may be used in other embodiments. Thus, generally, at least two memory dies 630 may be used, as may vary from embodiment to embodiment. As indicated in direction vector column 504-1 for stack 3, interposer 650 faces upward. As indicated in direction vector columns 504-2 through 504-5 for stack 3, memory dies 630 all face downward. However, in another embodiment memory dies 630 may all face upward as generally indicated by dashed lines 639. Moreover, a combination of upward and downward facing memory dies 630 may be used in yet another embodiment. Communication to and from memory dies 630 may be in parallel to enhance overall bandwidth.

For row 510-4 or SERDES and I/Os stack 4, there are 2 strata, as indicated in stack column 502, composed of strata 601 and 602. As indicated in and by device type vector column 503-1, interposer 650 occupies stratum 601 and is a passive die. As indicated in and by device type vector column 503-2, a SERDES die 640 occupies strata 602, and is an active die. As indicated in direction vector column 504-1 for stack 4, interposer 650 faces upward. As indicated in direction vector columns 504-2 for stack 4, SERDES die 640 faces downward. Communication to and from SERDES die 640 on a system side 212 may be in serial. Communication to and from SERDES die 640 and programmable logic dies 620 may be in parallel to enhance overall bandwidth, and such parallel communication may be enhanced by parallel communication between programmable logic dies 620. By having programmable logic dies 620 face one another in a stack, parallel communication to and from such programmable logic dies 620 using microbumps may be provided to enhance bandwidth, as previously described. In other words, a stack effectively has increased pin density. Communication to and from SERDES die 640 and optical engine 610 may be in either parallel or serial. Conventionally, optical engines do not include a serializer-deserializer, so communication from optical engine 610 to and from SERDES die 640 in such embodiments would be serial. Furthermore, communication to and from SERDES die 640 through interposer 650 using one or more TSVs 318 may be in series. SERDES die 640 may include MGTs and I/O drivers. Along those lines, in this embodiment, programmable logic dies 620, such as FPGA dies for example, do not have to include SERDES capabilities.

Interposer 650 may have a maximum interposer width 801 and a maximum interposer height 802. Multi-die stack package 600 may have a maximum width 803 and a maximum height 804, which are each respectively less than maximum interposer width 801 and a maximum interposer height 802

By modularizing stacks, a single tall stack and/or a stack of dissimilar dies may be avoided. Thus, for example, having optical dies, PLD dies, and memory dies all in a same stack is avoided. This avoids heat dissipation complexity associated with a single stack, and allows for more variation in die orientation, namely upward or downward facing. For example, this ability to vary orientation allows for a single package to have an upward facing optics die to more easily interconnect optical fiber, and have both a downward facing SERDES die to avoid introducing stress from TSVs, and have both PLD dies facing one another to increase interconnect density between such PLD dies, Furthermore, having stack assemblies of same or similar dies facilitates modular testing to provide known-good stacked assemblies prior to coupling to an interposer. Thus, experience of manufacturers in testing particular types of dies may be leveraged by a system integrator, and such system integrator need not have such experience in testing such particular types of dies. Lastly, by having die more tailored, such as FPGAs without MGTs for example, such FPGAs generally may be manufactured using more aggressive lithography to create more dense circuitry on a die, which may in turn promote speed and/or bandwidth. Furthermore, by packaging optical engine 610 with FPGAs 620, voltage levels, signaling schemes, drive currents, and control signals, among other optoelectronic interfacing may be tailored to be convenient with FPGAs 620.

With additional reference to FIG. 2, in an embodiment, programmable logic dies 620 may provide MAC-Interlaken bridge 203; optical engine 610 may provide integrated photonics 201, memory dies 630 may provide packet buffer 205, and SERDES die 640 may provide an ultra-short-reach SERDES 202 and an Interlaken SERDES 204. Integration of photonics may reduce interface power consumption between optics and electronics. Thus, multi-die stack package 600 may provide an optical-electronic hybrid line card for a front end of network server system, as described elsewhere herein with reference to FIG. 2.

Figure 7:
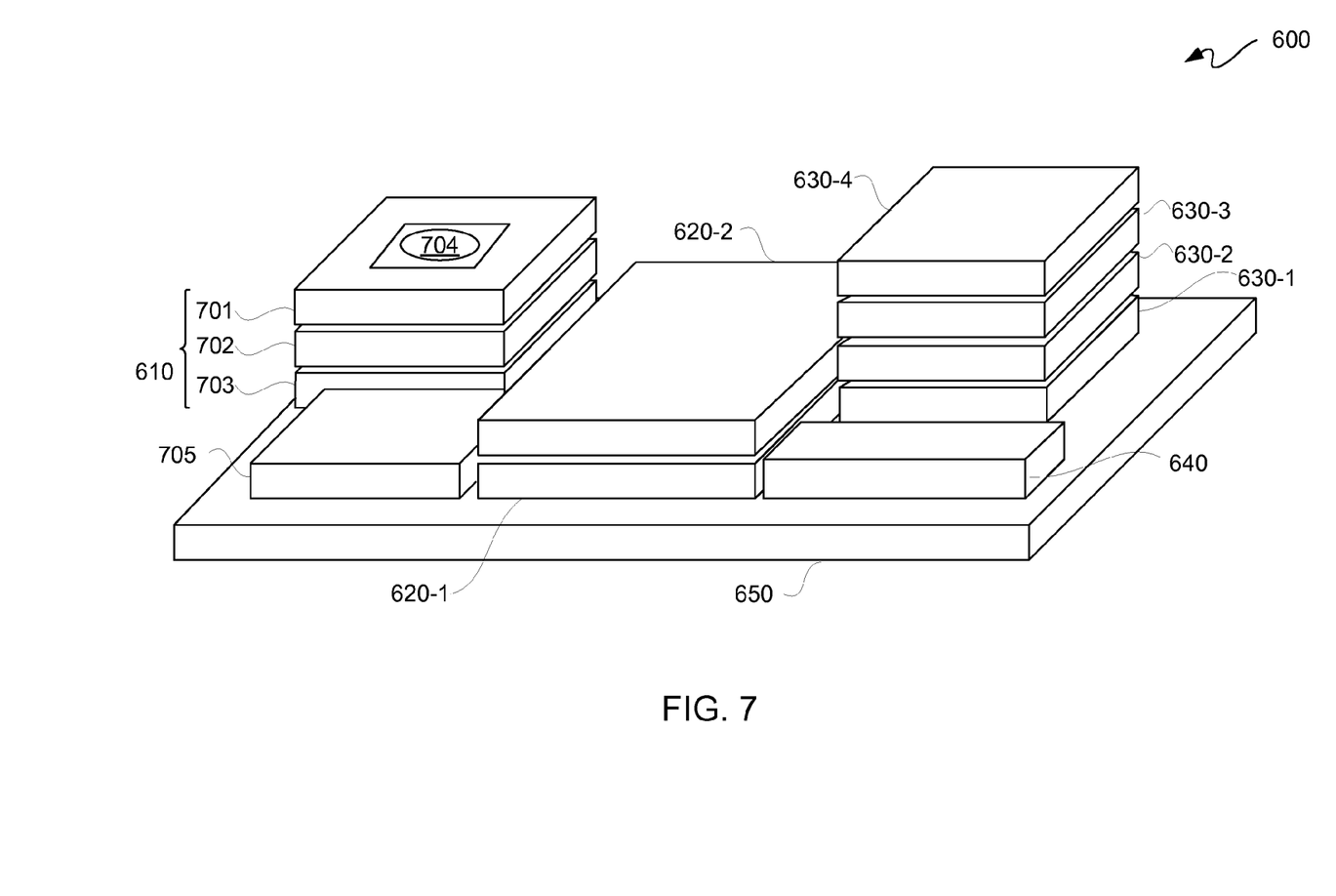
FIG. 7 is a block diagram of a perspective view depicting another exemplary embodiment of a multi-die stack package.

FIG. 7 is a block diagram of a perspective view depicting another exemplary embodiment of a multi-die stack package 600. Multi-die stack package 600 is the same as that of FIG. 6, except that an optical engine 610 is depicted as a stack of dies 701 through 703, and a fifth die stack is added, where such fifth stack includes an optional power supply die 705 coupled to interposer 650 for supplying power to one or more stacks of multi-die stack package 600, including without limitation optical engine 610. Optical engine includes an optical TX die 701 including laser 704, optical RX die 702, and optical interface die 703. Optical interface die 703 is coupled to interposer 650, and optical RX die 702 is stacked on top of optical interface die 703. Optical TX die 701 is stacked on top of RX die 702.

In this embodiment, optoelectronics die 610 can optionally include a laser 704, which may be powered by in package by power supply die 705. However, in another embodiment, laser 704 may be powered by either an off- or out-of-package optical power supply. In such an embodiment, power supply die 705 may or may not be included as part of multi-package die 600.

As a laser 704, which may be a vertical-cavity surface-emitting laser ("VCSEL") for example, may be sensitive to heat, in an embodiment optical engine 610 may not include a laser 704 to increase thermal budget. In other words, in another embodiment, optical engine 610 may not include optical TX die 701.

Fiber optic cabling 660, as illustratively depicted with reference to FIGS. 6-1 and 6-2, may be coupled to optical TX die 701 and optical RX die 702. In an embodiment of optical engine 610 for reception only, namely in an embodiment where laser 702 is not included in such IC package, fiber optic cabling may only be coupled to optical RX die 702. Even though VCSEL is illustratively depicted, in other embodiments an edge or side emitting laser may be used.

Returning to FIGS. 6-1 and 6-2, optical engine 610 may include TSVs 317 coupled to TSVs 318 or die-to-die interconnects 321 of interposer 650. Such vias and interconnects may be used for electronic I/Os. Because optical engine 610 faces up for fiber attachment, TSVs 317 in optical engine 610 may be used for optical-to-electrical coupling. Whereas, TSVs 318 may be for power supply pins for powering optics, which may have different voltage level and/or current level parameters than electronics. TSVs 318 may further be for control and status signal pins, such as for manufacturing tests for example, or ground pins.

Selection of which die face up and which die face down may be based in part on how sensitive such die is to forming through substrate vias. More particularly, active die are more likely to be sensitive to through substrate vias than passive die. Stresses introduced by formation of through substrate vias in an active die may affect transistor performance. For example, TSVs in an active die may induce stress in a silicon substrate by etching holes and/or filling such holes, which may affect transistor performance. By having SERDES die 640 face down for example, no TSVs need to be used in SERDES die 640, and thus likelihood of introducing stresses on transistors in SERDES die 640, where such transistors are used to transmit and receive tens of Gb/s of signals for example, is reduced.

With respect to 3D DRAM stack 3, DRAM manufactures are already stacking DRAM dies with TSVs. Moreover, signals that go through these DRAM die TSVs may be at a much slower rate than SERDES die 640. For example, in an embodiment, DRAM die may be clocked at approximately 500 MHz to 700 MHz; in contrast to SERDES die 640, which in such an embodiment may operate to carry signals in excess of 28 Gb/s.

Figure 9:
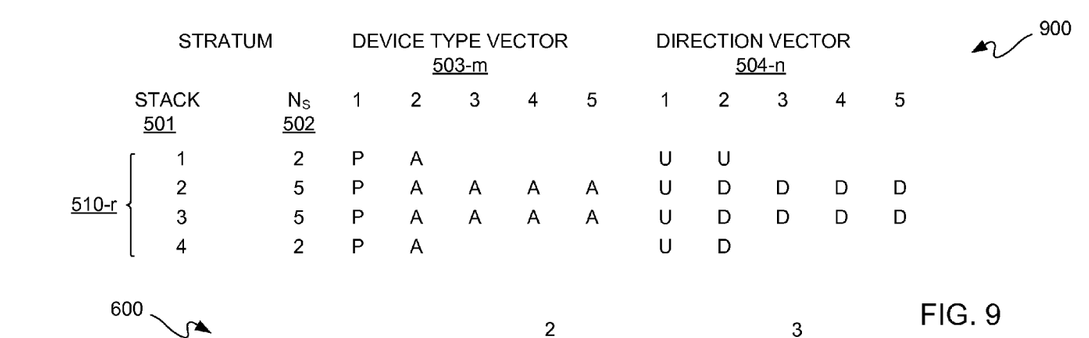
FIG. 9 is a table diagram depicting an exemplary embodiment of a strata chart for the exemplary embodiment of a multi-die stack package of FIGS. 10-1 and 10-2.
Figure 41:
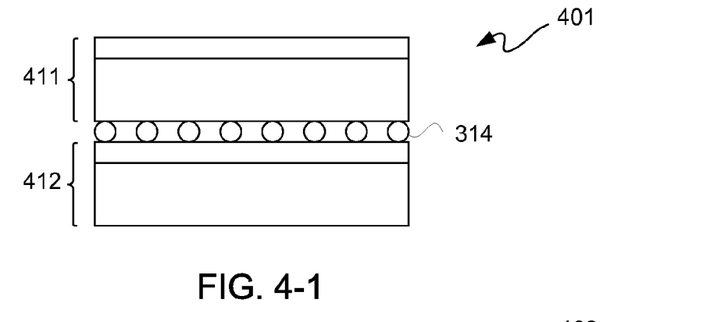
Figure 42:
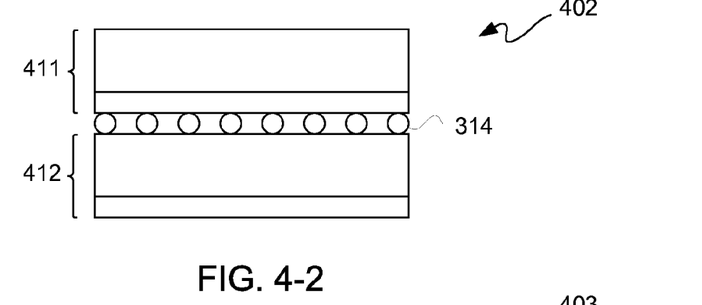
Figure 43:
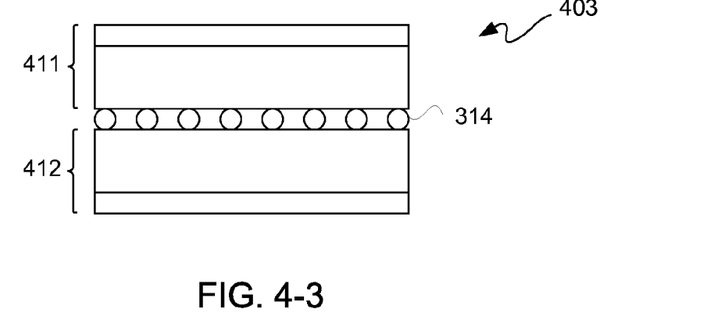
Figure 44:
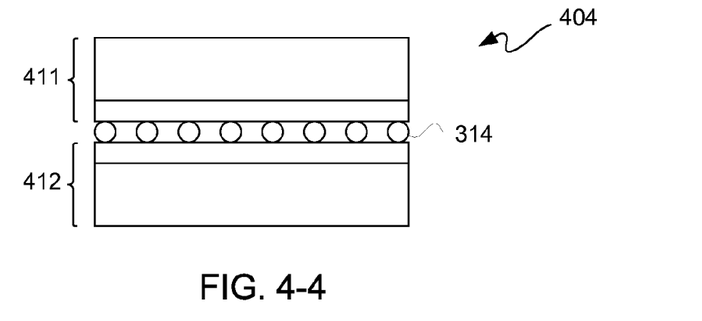
Figure 101:
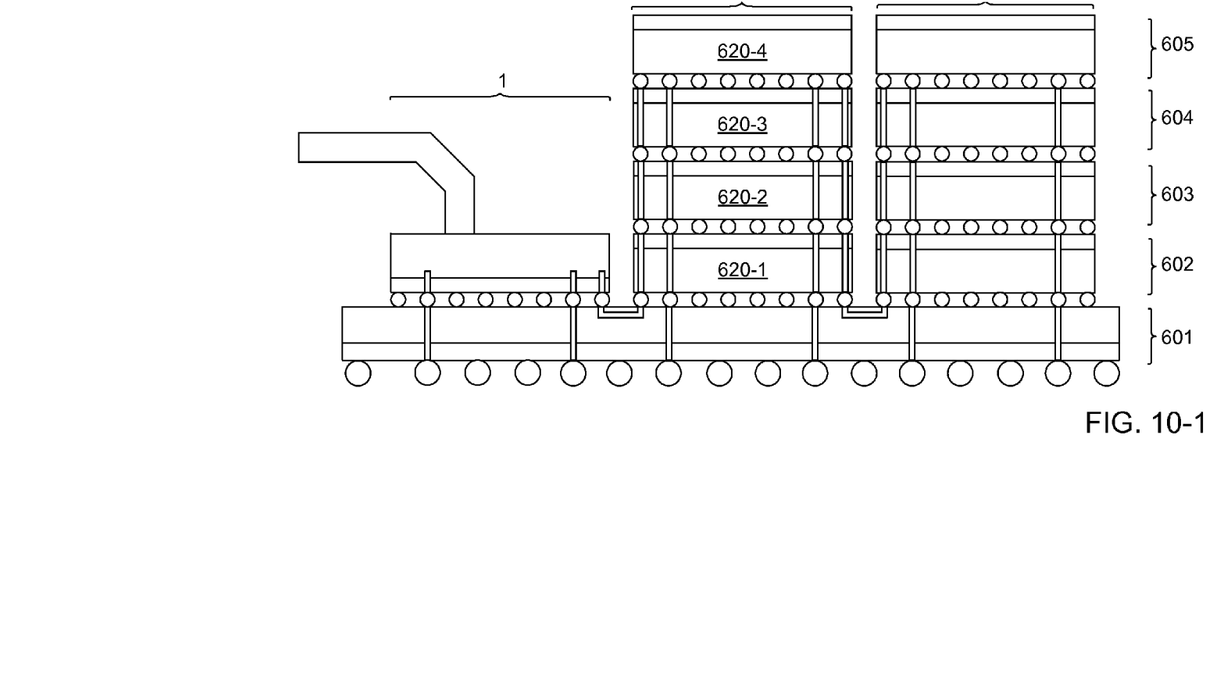
Figure 102:
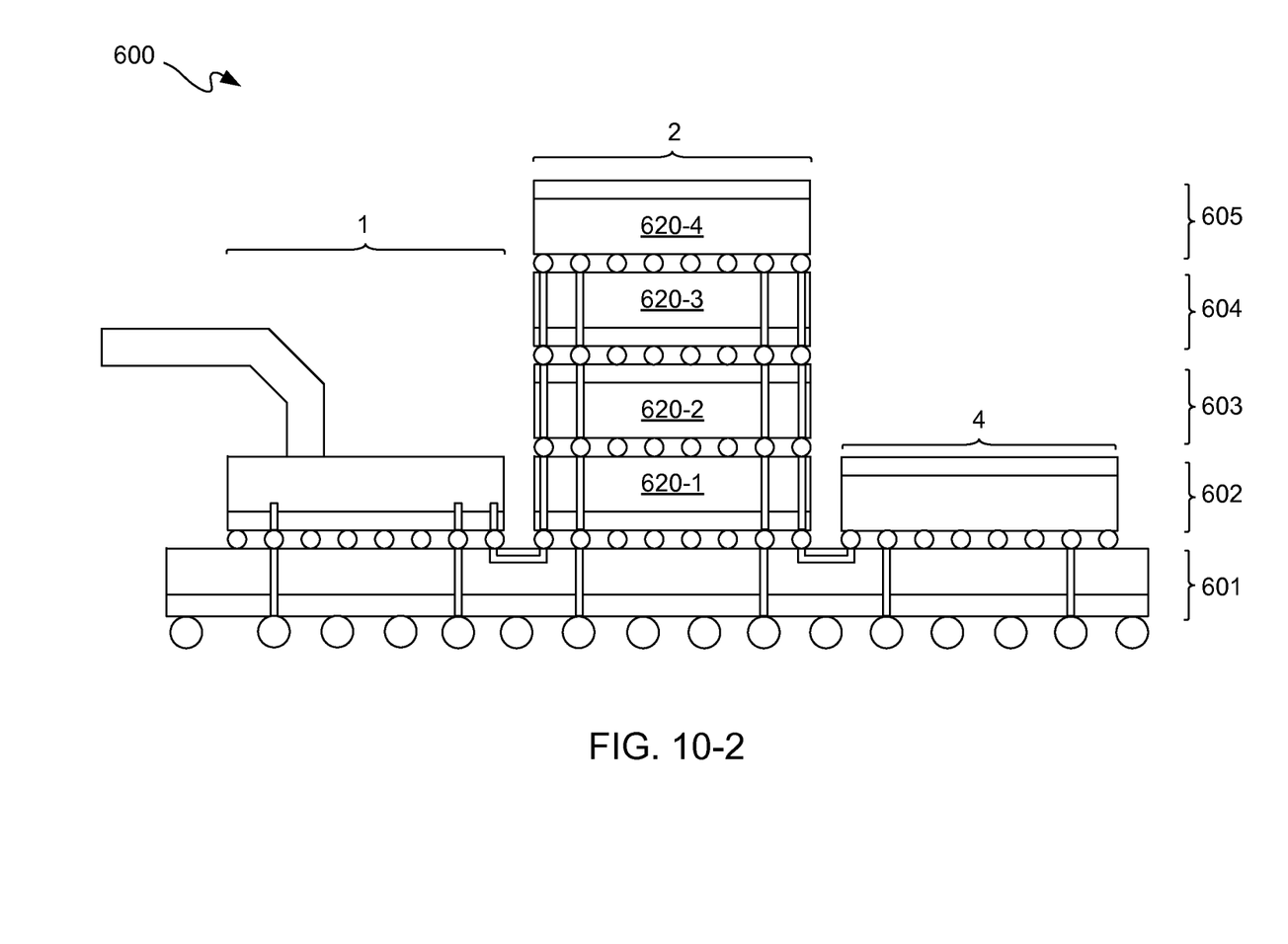

FIG. 9 is a table diagram depicting an exemplary embodiment of a multi-die stack package strata chart ("strata chart") 900. Stratum chart 900 is for another embodiment of a multi-die stack package, namely multi-die stack package 600 of FIGS. 10-1 and 10-2. FIGS. 10-1 is a block diagram of a cross-sectional view depicting another exemplary embodiment of multi-die stack package 600 from one side, and FIGS. 10-2 is a block diagram of a cross-sectional view depicting the exemplary embodiment of multi-die stack package 600 of FIGS. 10-1 from an opposite side. Stratum chart 900 is further described simultaneous reference to FIGS. 9, 10-1, and 10-2. Because the embodiments of multi-die stack package 600 of FIGS. 6-1, 6-2, 10-1, and 10-2, and thus strata charts 500 and 900, is generally the same, much of the same description is not repeated below for purposes of clarity and not limitation.

Using the above-described nomenclature, strata chart 900 includes stack number column 501, number of strata in a stack column ("stacked column") 502, m device type vector columns 503-1 through 503-5, and n direction vector columns 504-1 through 504-5. Rows 510 correspond to stack numbers in FIGS. 10-1 and 10-2.

For row 510-2 or a 3D PLD stack 2, there are 5 strata, as indicated in stack column 502, composed of strata 601 through 605. As indicated in and by device type vector column 503-1, interposer 650 occupies stratum 601 and is a passive die. As indicated in and by device type vector column 503-2, programmable logic dies (e.g., FPGAs in this embodiment) 620-1 through 620-4 respectively occupy strata 602 through 605, and all such programmable logic dies 620 are active dies. As indicated in direction vector column 504-1 for stack 2, interposer 650 faces upward. As indicated in direction vector columns 504-2 through 504-5 for stack 2, programmable logic dies 620-1 through 620-4 all face downward. Communication to and from programmable logic dies 620-1 through 620-4 may be conducted in parallel to enhance overall bandwidth.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
an interposer;
a first die stack, a second die stack, a third die stack, and a fourth die stack coupled to the interposer;
wherein the interposer provides a common base for and a stratum of each of the first die stack, the second die stack, the third die stack, and the fourth die stack;
wherein the first die stack includes an optical engine that includes at least one optical engine die;
wherein the second die stack includes a plurality of programmable resource dies;
wherein the third die stack includes at least one memory die;
wherein the fourth die stack includes a serializer-deserializer die; and
wherein the interposer, the at least one optical engine die, the plurality of programmable resource dies, the at least one memory die, and the serializer-deserializer die are in different upward facing and downward facing combinations.

2. The apparatus according to claim 1, wherein portions of each of the first die stack, the second die stack, the third die stack, and the fourth die stack are known-good modules prior to being coupled to the interposer.

3. The apparatus according to claim 1, wherein the plurality of programmable resource dies includes at least two Field Programmable Gate Array dies.

4. The apparatus according to claim 1, wherein the at least one memory die is selected from a group consisting of Dynamic Random Access Memory ("DRAM"), Static Random Access Memory ("SRAM"), embedded DRAM, and embedded SRAM dies.

5. The apparatus according to claim 1, wherein:
the interposer is upward facing;
the at least one optical engine die is upward facing;
the plurality of programmable resource dies face one another; and
the serializer-deserializer die is downward facing.

6. The apparatus according to claim 1, wherein the at least one memory die includes a plurality of memory dies that are all either downward or upward facing.

7. The apparatus according to claim 1, wherein the plurality of programmable resource dies are all Field Programmable Gate Array dies.

8. The apparatus according to claim 6, wherein the plurality of memory dies are either all Dynamic Random Access Memory ("DRAM") dies, Static Random Access Memory ("SRAM") dies, embedded DRAM dies, or embedded SRAM dies.

9. The apparatus according to claim 1, wherein:
the interposer is upward facing;
the at least one optical engine die is upward facing;
the plurality of programmable resource dies are all downward facing; and
the serializer-deserializer die is downward facing.

10. The apparatus according to claim 9, wherein the at least one memory die includes a plurality of memory dies that are all either downward or upward facing.

11. The apparatus according to claim 1, wherein the interposer is a passive interposer.

12. The apparatus according to claim 1, wherein the at least one memory die provides a bi-directional buffer for a router line card provided with the optical engine, the plurality of programmable resource dies, and the serializer-deserializer die.

13. The apparatus according to claim 1, wherein the optical engine does not include a laser.

14. An apparatus, comprising:
an interposer;
a first die stack, a second die stack, a third die stack, a fourth die stack, and a fifth die stack coupled to the interposer;
wherein the interposer provides a common base for and a stratum of each of the first die stack, the second die stack, the third die stack, the fourth die stack, and the fifth die stack;
wherein the first die stack includes an optical engine that includes a plurality of optical engine dies;
wherein the second die stack includes a plurality of programmable resource dies;
wherein the third die stack includes at least one memory die;
wherein the fourth die stack includes a serializer-deserializer die; and
wherein the fifth die stack includes a power supply die.

15. The apparatus according to claim 14, wherein the power supply die is for powering a laser of the optical engine.

16. The apparatus according to claim 15, wherein the laser is a vertical-cavity surface-emitting laser.

17. The apparatus according to claim 14, wherein the plurality of programmable resource dies has at least two Field Programmable Gate Array dies.

18. The apparatus according to claim 14, wherein:
the interposer is upward facing;
the plurality of optical engine dies includes an optical receiver ("RX") die;
the optical RX die is upward facing;
the plurality of programmable resource dies face one another;
the at least one memory die includes a plurality of memory dies that are all either upward or downward facing; and
the serializer-deserializer die is downward facing.

19. A method for providing a router line card, comprising:
obtaining an interposer;
coupling a first known-good module, a second known-good module, a third known-good module, and a fourth known good module to the interposer to respectively provide a first die stack, a second die stack, a third die stack, and a fourth die stack;
wherein the interposer provides a common base for and a stratum of each of the first die stack, the second die stack, the third die stack, and the fourth die stack;
wherein the first die stack includes an optical engine including at least one optical engine die;
wherein the second die stack includes a plurality of programmable resource dies;
wherein the third die stack includes at least one memory die;
wherein the fourth die stack includes a serializer-deserializer die; and
wherein the interposer, the at least one optical engine die, the plurality of programmable resource dies, the at least one memory die, and the serializer-deserializer die are in different upward facing and downward facing combinations.

20. The method according to claim 19, wherein
the interposer is upward facing;
the at least one optical engine die includes an optical receiver ("RX") die;
the optical RX die is upward facing;
the plurality of programmable resource dies face one another;
the at least one memory die includes a plurality of memory dies that are all either upward or downward facing; and
the serializer-deserializer die is downward facing.

* * * * *